United States Patent
Roth

(10) Patent No.: US 7,042,746 B2
(45) Date of Patent: *May 9, 2006

(54) METHOD AND APPARATUS FOR PERFORMING VARIABLE WORD WIDTH SEARCHES IN A CONTENT ADDRESSABLE MEMORY

(75) Inventor: Alan Roth, Austin, TX (US)

(73) Assignee: Mosaid Technologies Inc., Kanata (CA)

( * ) Notice: Subject to any disclaimer, the term of this patent is extended or adjusted under 35 U.S.C. 154(b) by 47 days.

This patent is subject to a terminal disclaimer.

(21) Appl. No.: 10/902,687

(22) Filed: Jul. 30, 2004

(65) Prior Publication Data

US 2005/0052907 A1    Mar. 10, 2005

Related U.S. Application Data

(63) Continuation of application No. 10/158,196, filed on May 31, 2002, now Pat. No. 6,771,525.

(51) Int. Cl.
*G11C 15/00* (2006.01)

(52) U.S. Cl. .............. 365/49; 365/185.25; 365/189.01; 365/189.07

(58) Field of Classification Search ................ None
See application file for complete search history.

(56) References Cited

U.S. PATENT DOCUMENTS

| 6,081,441 | A | 6/2000 | Ikeda |
| 6,252,789 | B1 | 6/2001 | Pereira et al. |
| 6,373,738 | B1 | 4/2002 | Towler et al. |
| 6,535,410 | B1 | 3/2003 | Yanagawa |
| 6,771,525 | B1 * | 8/2004 | Roth .......................... 365/49 |

* cited by examiner

Primary Examiner—David Nelms
Assistant Examiner—Long Tran

(57) ABSTRACT

A content Addressable memory (CAM) for performing search operations using variable width search data, said CAM comprising a plurality of arrays of CAM cells, each coupled to a respective sub-search data bus, the sub-search buses being confined to form a main search data bus, to which is applied the search data; selector circuits receiving match line signals from respective CAM arrays, the match line signals being indicative of the results of a search and comparison formed in the associated CAM array, the selector circuit being responsive to a mode selection signal for selecting one or more of said match line output signals to be switched to a priority encoder and multiple match resolver (PE-MMR), wherein in a first mode the match line output signals are switched to said PE-MMR and in a second mode groups of match line output signals from selected arrays are switched to said PE-MMR.

11 Claims, 6 Drawing Sheets

METHOD AND APPARATUS FOR PERFORMING VARIABLE WORD WIDTH SEARCHES IN A CONTENT ADDRESSABLE MEMORY

This application is a continuation application from U.S. application Ser. No. 10/158,196, filed May 31, 2002 now U.S. Pat. No. 6,771,525.

The present invention relates to a Content Addressable Memory (CAM), and more specifically to a method and circuit for searching a CAM with variable width search data, wherein the width of the search data may be changed on each search instruction.

BACKGROUND OF THE INVENTION

A CAM is a memory device which allows a processor within a computer, to perform a parallel search through the CAM's stored data in order to retrieve the address of any matching stored data if such data is found. The search and stored data can be either binary (comprising logic "1" or "0" state) or ternary (logic "1", "0" or "don't care" states) data.

A CAM is usually subdivided in banks of CAM cell arrays. A CAM array comprises a plurality of CAM cells arranged in rows and columns with row of the cell being connected to an associated match line and cells being connected to associated search lines. The cells are also coupled to word lines and bit lines for retrieving information out of and for storing information in the CAM.

During a search operation, search data often referred to as a search key of a particular width is placed on the search lines. The search key on the search data lines is-compared with stored data in all CAM cell locations simultaneously and a match (also referred to as a "hit") or mismatch result (also referred to as a "miss") is provided to match lines coupled to each CAM cell. If the search key matches the information stored in a particular row in the CAM, the associated match line will indicate a hit or match condition. If the search key and the stored data are different, the associated match line will indicate a miss or mismatch condition. All match line outputs are processed by a multiple match resolver (MMR) and priority encoder (PE) block that will provide as an output signal the highest priority match address where the match information is located.

Conventional CAM's are mode configurable to perform search operations on data words having specific word widths for example, 144 bit or 288 bit search modes. Typically in such CAM's, a configuration register stores the operating mode of the device and fields within the register specify the word width. Data will be written into the CAM according to the word width setting in the mode register and search instructions issued to the CAM will therefore search the stored data based on the word width specified in the configuration register. In order to charge the word width the mode register must first be updated and then the new search is performed. Thus, variable word width searching "on-the-fly" is not supportable by such conventional CAM's. Thus, although pre-set word-width CAM's do exist, there is still a need for a CAM that supports arbitrary word width searches and which is capable of switching between one or more types of searching on-the-fly.

Some conventional approaches have been proposed for searching words which are wider than default word widths stored in a CAM, for example in U.S. Pat. No. 6,252,789 to Pereira et al. Such approaches however require extra width expansion circuitry associated with each CAM row for handling situations when search data words that are wider than the default stored word width. Furthermore, such width expansion circuitry are interconnected and a match result is not provided to a priority encoder until the last word in a multiword data chain has been compared to the contents of the data stored in the CAM. This approach therefore is only effective in exact match multiple word searches.

Thus, there is still a need for a CAM that is capable of performing variable word width searching with search data widths that can be changed on-the-fly, and while storage of data words makes efficient use of the CAM.

SUMMARY OF THE INVENTION

In accordance with this invention there is provided a content addressable memory (CAM) for performing search operations using variable width search data, the CAM comprising:

a) a plurality of arrays of CAM cells, each coupled to a respective sub-search data bus, the sub-search buses being confined to form a main search data bus, to which is applied the search data;

b) selector circuits receiving match line signals from respective CAM arrays, the match line signals being indicative of the results of a search and comparison formed in the associated CAM array, the selector circuit being responsive to a mode selection signal for selecting one or more of the match line output signals to be switched to a priority encoder and multiple match resolver (PE-MMR), wherein a first mode or all match line output signals are switched to the PE-MMR and in a second mode groups of match line output signals from selected arrays are switched to the PE-MMR, whereby wide width data searching is performed by simultaneously evaluating match line outputs from the plurality of arrays.

An advantage of the invention is the ability to perform variable word width searches (72, 144 and 288 bit wide words for example) with the ability to change the searchable word width mode on-the-fly; i.e. on each new search instruction issued to the CAM device.

In accordance with another aspect of the invention, there is provided a method for performing variable word width searching in a content addressable memory comprises selectively combining match line latch outputs from two adjacent CAM memory arrays and providing the selectively combined match line outputs to a multiple match resolver/priority encoder in response to a variable word width control signal. If a 72 bit mode search is performed, the priority encoder will simultaneously receive and process four separate match line latch outputs match line locations in adjacent arrays. If a 144 bit mode search is performed, then a combination of two match line latch outputs are provided from two adjacent arrays to the priority encoder. If a 288 bit mode search is performed, a combination of four match line latch outputs is provided to the priority encoder.

BRIEF DESCRIPTION OF THE DRAWINGS

The features and advantages of the present invention are illustrated by way of example and are by no means intended to limit the scope of the present invention, the particular embodiments of which are described in the following figures as follows.

DETAILED DESCRIPTION OF THE INVENTION

Figure 1:
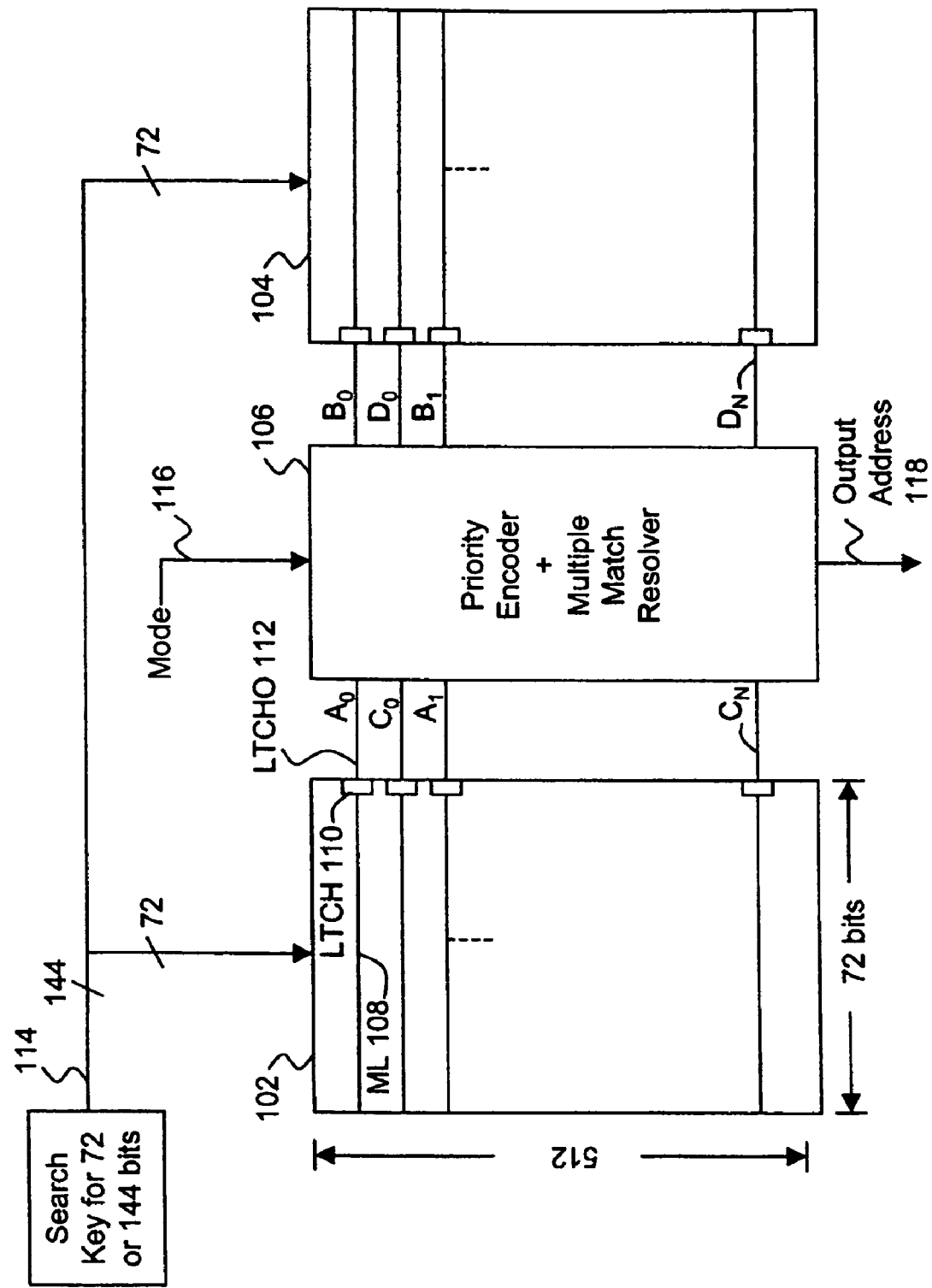
FIG. 1 is a simplified block diagram of a CAM according to an embodiment of the invention.

In the following description like numerals refer to like structures in the drawings.

FIG. 1 illustrates the general structure of a CAM 100 according to an embodiment of the invention. The CAM 100 comprises two arrays 102 and 104 respectively, wherein each CAM array is comprised of 512 rows, and associated match lines ML 108, by 72 bits (not including any redundancy rows or columns). The plurality of arrays of CAM cells, each coupled to a respective sub-search data bus, the sub-search buses being combined to form a main search data bus, to which is applied the search data. In this example each row of memory cells is connected to a single match line ML 108 and can store up to 72 bits of data, which can be binary data or ternary data. In order to store words wider than 72 bits, two arrays are used to store an upper and lower portion the a wide word. For example, in order to store a 144 bit word, 72 bits would be stored in one array in a row and the other 72 bits would be stored in an associated row in the adjacent array. In order to store a 288 bit word, two 144 bit words would be stored as described at two subsequent row locations in the two adjacent arrays.

Each match line ML 108 has an associated match line latch LTCH 110 for storing the result of a search performed on that row. The match line latch LTCH 110 has a 1 bit match line latch output LTCHO 112 which will be set to logic "1", representing a "hit" condition, if the searched data matches the stored data, or will be set to a logic "0", representing a "miss" condition, if the search data and stored data do not match. Each of the match line latch output LTCHO 112 is connected to the priority encoder and multiple match resolver 106. If a plurality of "hits" are found in a CAM array, the priority encoder and multiple match resolver 106 will choose the hit having the highest priority address and provide that highest priority address as the output 118. For example, with reference to FIG. 1, a representative group of four match lines and their corresponding match line latch outputs LTCHO 112 are designated by four outputs $A_0$, $B_0$, $C_0$ and $D_0$. This pattern is repeated for the remainder of the arrays as $A_i$, $B_i$, $C_i$ and $D_i$ wherein i takes values from 0 to N.

In order to support variable word width searches, the search data bus 114, shown as 144 bits wide, is split into two 72 bit wide buses each accessing arrays 102 and 104 respectively. When a search is performed, all the CAM arrays are accessed in parallel. Along with search data provided on the search data bus 114, a search mode control signal indicative of the word width search mode must be provided. The search mode control signal will indicate whether a 72 bit, 144 bit or 288 bit search is to be performed. By providing this control signal with every search instruction, the device has the capability to perform different word width searches with each consecutive search instruction, i.e., the device can support variable word width on-the-fly searching.

If a 72 bit search instruction is issued, the same 72 bit search key will be loaded onto the upper 72 bits and the lower 72 bits of the search data bus 114 and the search data will be compared with stored data in all rows of the two CAM arrays. A match may result in any one or more 72 bit locations in either of the two arrays.

If a 144 bit search instruction is issued, the 144 bit search data will be loaded onto the search data bus 114 and will be compared with stored data in the two CAM arrays 102 and 104. A match condition will occur if for any particular row, there will be a match of the upper and lower 72 bits of the search word.

If a 288 bit search instruction is issued, then two consecutive searches of 144 bits each are performed. A match result requires that four adjacent 72 bit segments match the search data, two in array 102 and two in array 104.

Figure 2:
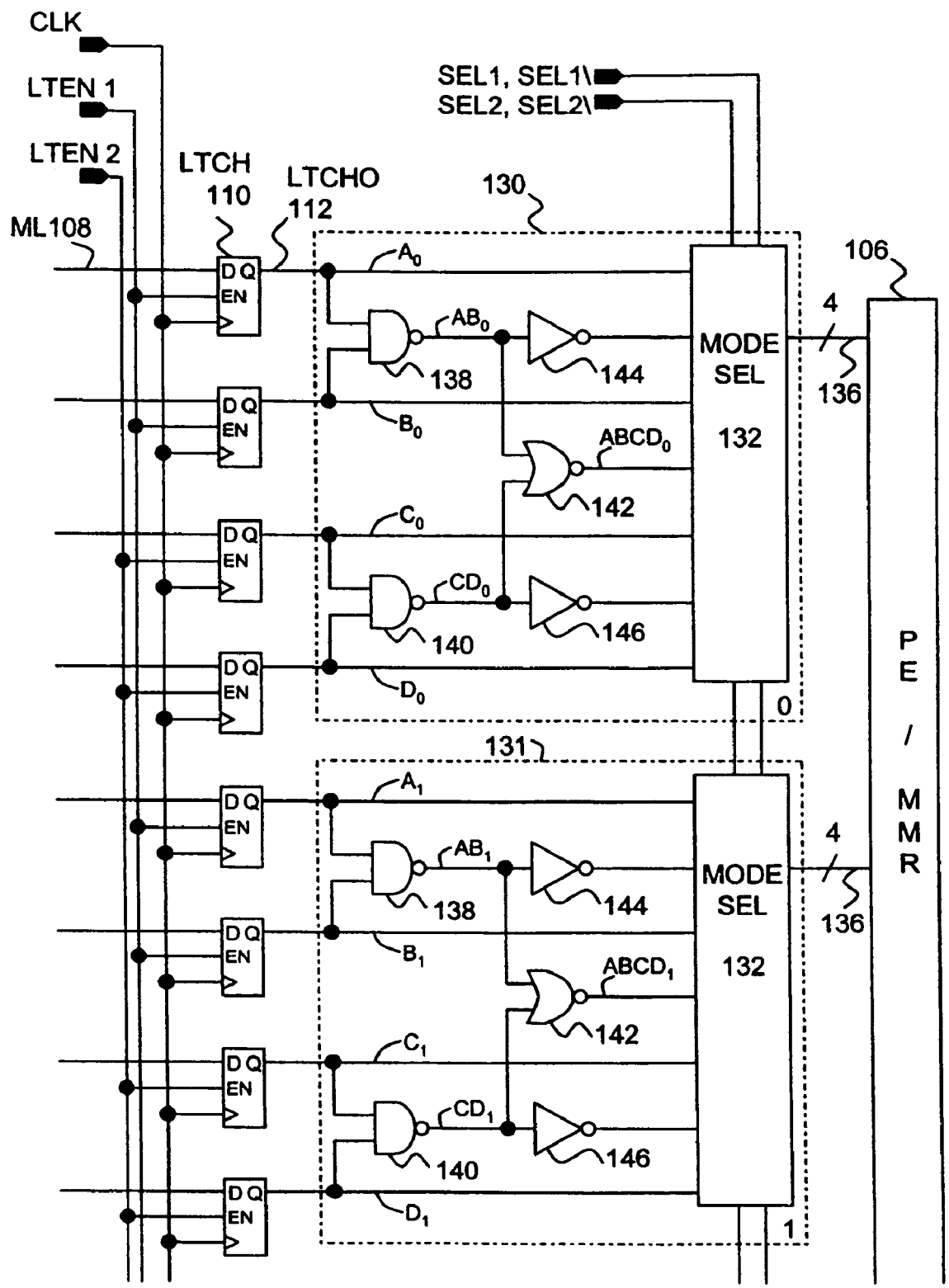
FIG. 2 is a simplified circuit and block diagram illustrating an embodiment of the invention.

FIG. 2 shows a preferred embodiment of the present invention supporting 72, 144 or 288 bit word width searching, and providing the ability to change search modes "on-the-fly". The match line latch outputs LTCHO 112 are designated as $A_0$, $B_0$, $C_0$, and $D_0$ for the first group of four match line latch outputs, each representing the result of a 72 bit search in every match line 108.

If a 72 bit search is to be performed on the CAM, the user (processor) will provide the search mode information to the search mode selection circuit 130. The search mode selection circuit 130 comprises mode selector circuitry 132 and a circuit for selectively combining the match line latch outputs LTCHO 112 comprising two NAND logic gates 138, 140, a logic NOR gate 142, and inverters 144 and 146.

When a 72 bit search is performed, each latch LTCH 110 in every match line 108 of both CAM arrays 102 and 104 are on an active state latching the result. This is achieved by asserting latch enable signals LTEN 1, LTEN 2. This is achieved by asserting latch enable signals LTEN 1, LTEN 2. That is latch signal enable LTEN 1 is applied for the first 144 bits and LTEN2 is asserted for the second 144 bits. Latch output signals LTCHO 112 $A_0$, $B_0$, $C_0$ and $D_0$ are provided through the mode selector 132 directly to the priority encoder 106 through the 4 bit wide output bus 136. This occurs when the select signal SEL1 is in a high logic state while signal SEL1/ will be in a low logic state and signals SEL2 and SEL2/ are in "don't care" logic state. Since the search is of 72 bit mode, none of the results provided by the logic gates 138, 140 and 142 are selected by the mode selector circuitry 132.

When a 144 bit search is to be performed, this instruction is provided to the search mode selection circuitry 130. Also, the 144 bit search key is divided into two 72 bit search keys, with the first 72 bits being provided to the first CAM array 102 and the second 72 bits being provided to the second CAM array 104. Once the search and compare operation is performed, all the latches LTCH 110 are activated latching the match line result of the comparison. The latch output results LTCHO 112 $A_0$, $B_0$, $C_0$ and $D_0$ are combined in NAND gates 138 and 140. The outputs of NAND gates 138 and 140 are provided to inverters 144 and 146 resulting in signals $A_0B_0$ and $C_0D_0$ respectively, which carry the result of a 144 bit search. The mode selector 132 receives the signals SEL1 set to logic low and signal SEL1/ set to logic high, thereby passing a "wide" search result to the priority encoder and multiple match resolver 106. In this case, the selection signal SEL2 is set to logic high and signal SEL2/ is set to logic low for providing the 144 bit search result. It should be noted that although the 72 bit search results $A_0$, $B_0$, $C_0$ and $D_0$ are received by the mode selector circuit 132, they are not provided to the priority encoder and multiple match resolver 106.

If a 288 bit search is chosen, the search is performed in two search cycles, each search cycle following a similar procedure as a 144 bit search followed for another 144 bit search, with some differences. In this case, the 288 bit key search is divided into four 72 bit search keys. The first and second 72 bit key words are submitted to the CAM arrays 102 and 104 respectively as in a 144 bit search. Then the latches LTCH 110 are selectively activated so that latches corresponding to matchlines $A_0$ and $B_0$ latch the result of the first search cycle. Thereafter, a second search with the third and fourth 72 bit key words are submitted to the CAM arrays 102 and 104 as in the previous step, but only the latches LTCH 110 corresponding to matchlines $C_0$ and $D_0$ are activated. Once all the results of the 288 bit search are latched as $A_0$, $B_0$, $C_0$ and $D_0$, they are provided to the NAND logic gates 138, 140, generating signals $AB_0$ and $CD_0$ respectively which are further combined by NOR gate 142, generating the $ABCD_0$ signal. Mode selector 132 receives selector signals SEL1 and SEL2 set to logic low (causing signals SEL1/ and SEL2/ to be set to logic high) and as a result, signal $ABCD_0$ is provided to the priority encoder and multiple match resolver 106.

In this manner a user can issue consecutive search instructions of varying word width, including 72, 144 or 288 bit wide searches using the same Content Addressable Memory.

Figure 3:
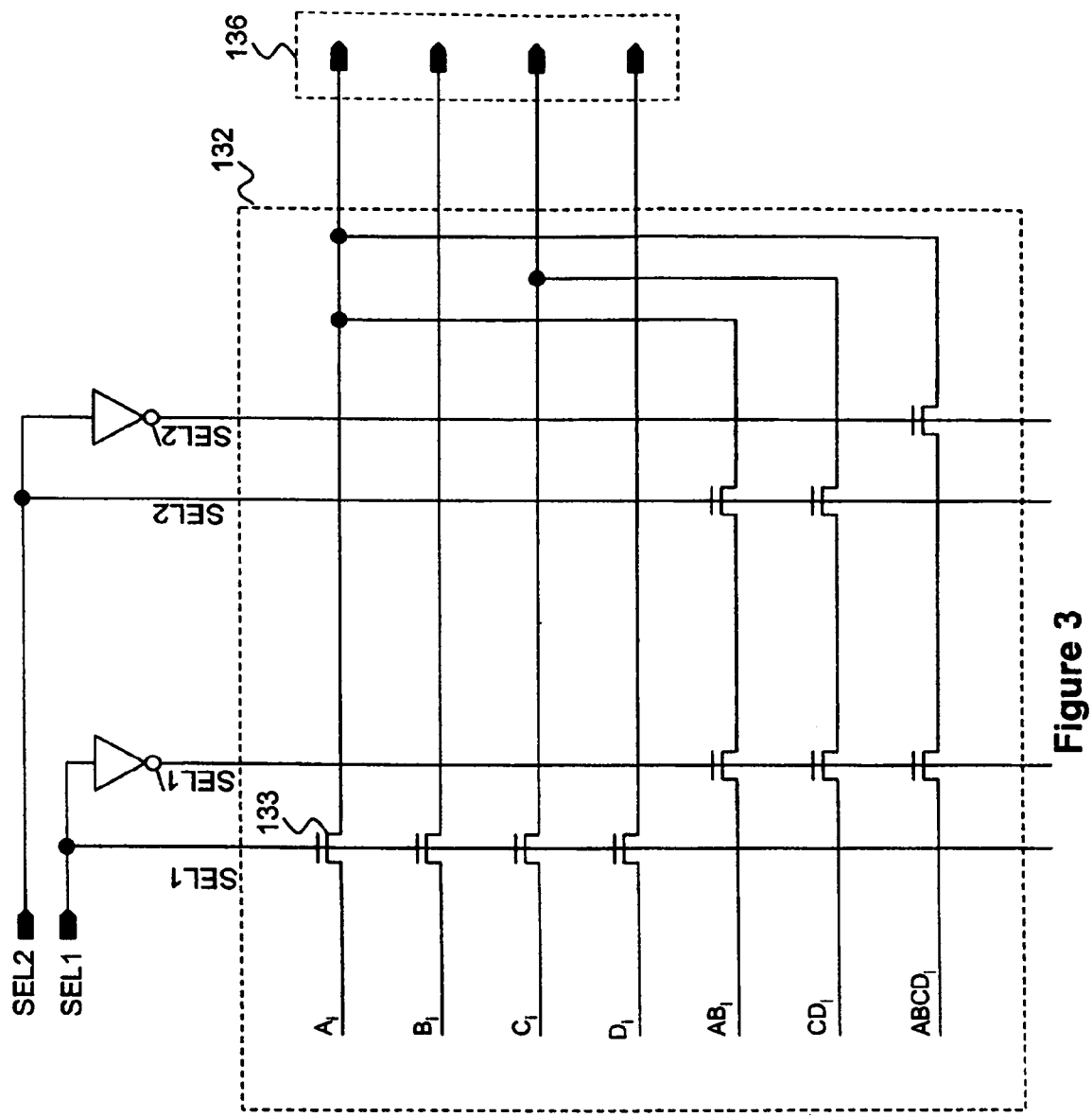
FIG. 3 is a schematic diagram showing the implementation of a word width selection circuit.

FIG. 3 is a detailed schematic illustrating the circuitry contained within the mode selector circuit 132 of FIG. 2. As can be seen, the mode selector circuit 132 is a multiplexer that receives as inputs the signals $A_i$, $B_i$, $C_i$, $D_i$, $AB_i$, $CD_i$, $ABCD_i$, as provided by the logic gates discussed with reference to FIG. 2. The multiplexer 132 is controlled by the select signals SEL1, SEL1/, SEL2, SEL2/ and outputs a 4 bit wide output signal 136 which is provided to the priority encoder/multiple match resolver circuit 106 as shown in FIG. 2. The operation of the multiplexer 132 will be readily apparent to someone skilled in the art and will therefore not be discussed in further detail.

Figure 4:
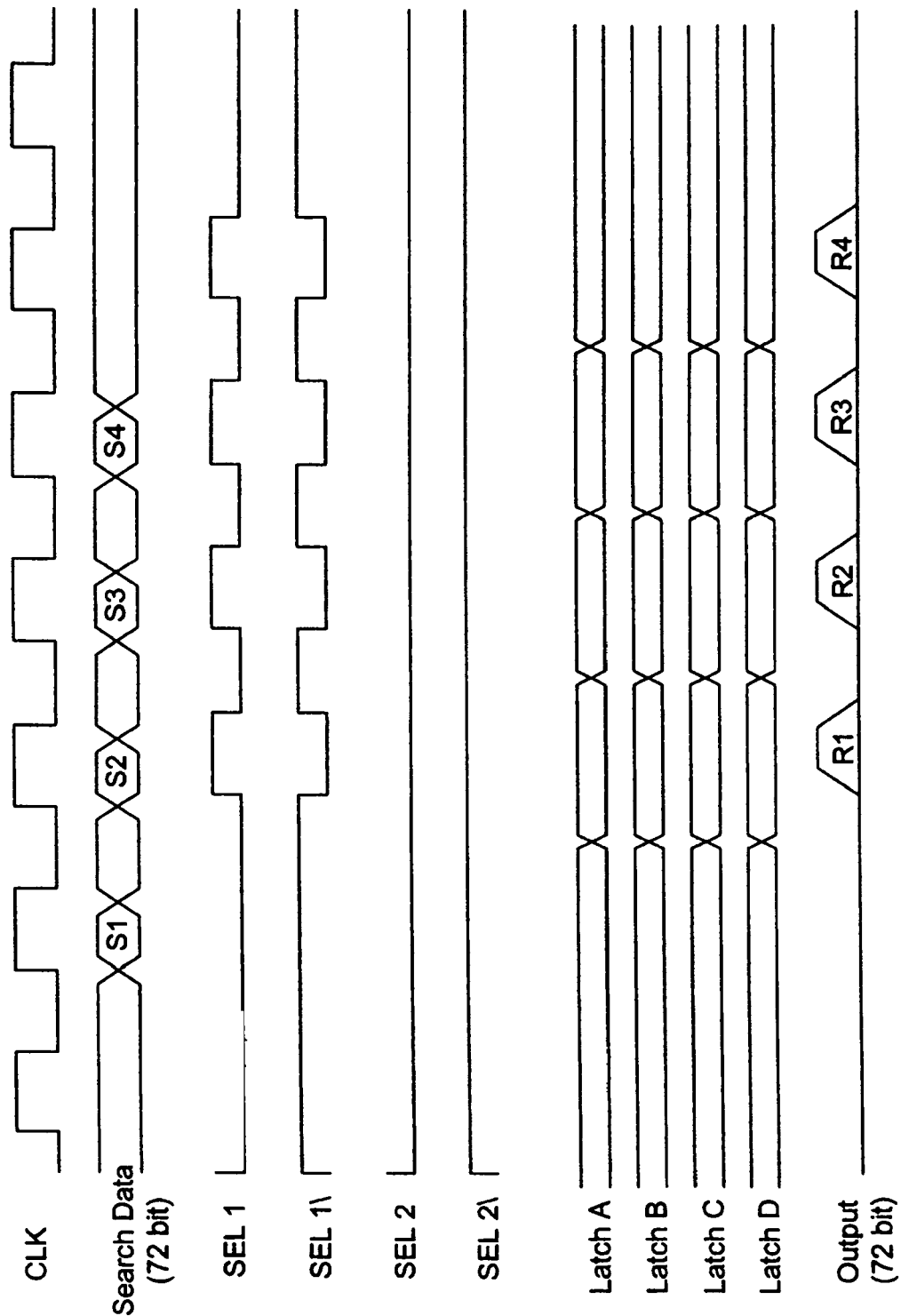
FIG. 4 is a timing diagram showing a 72 bit wide search operation according to the present invention.
Figure 5:
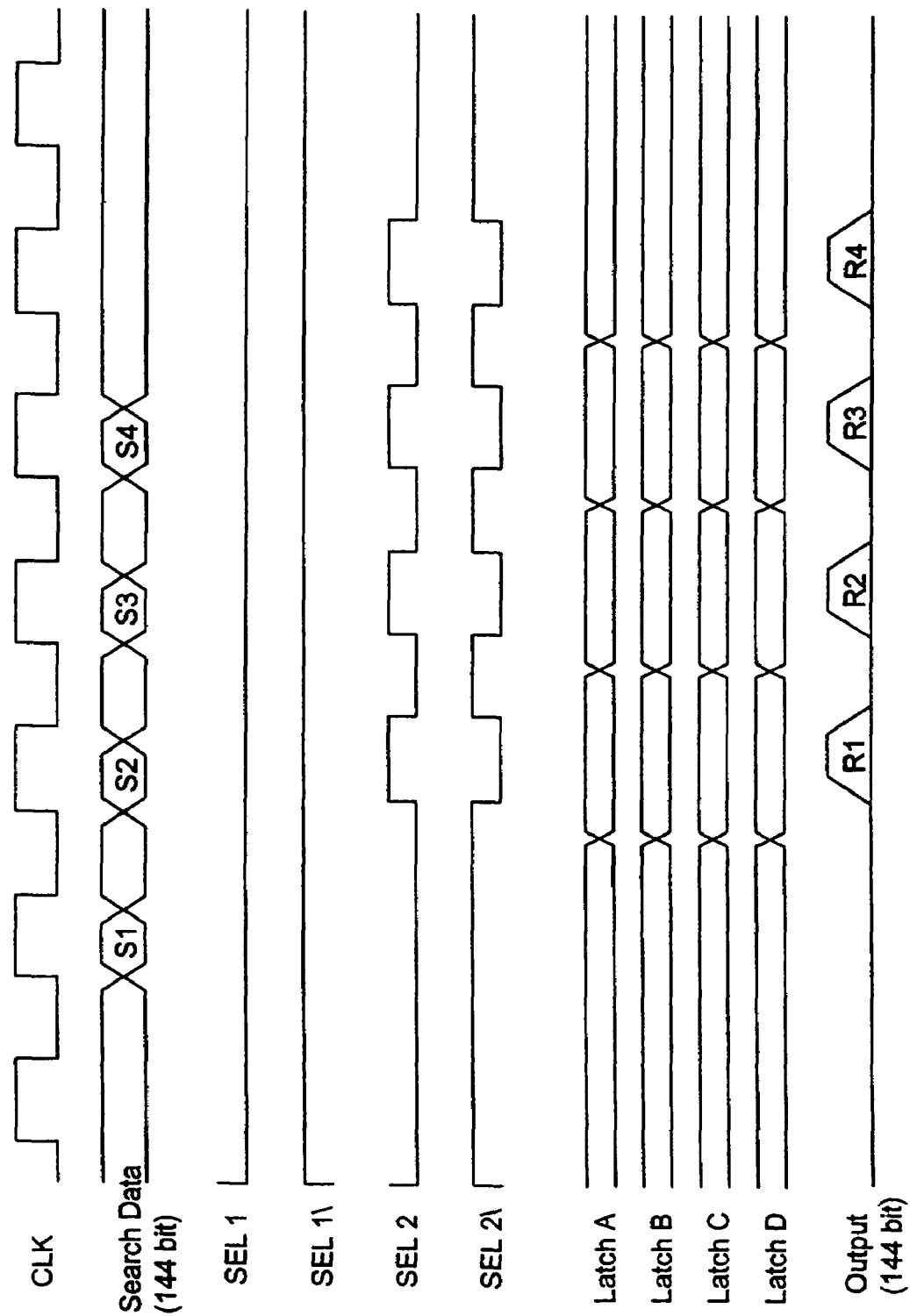
FIG. 5 is a timing diagram showing a 144 bit wide search operation according to the present invention.
Figure 6:
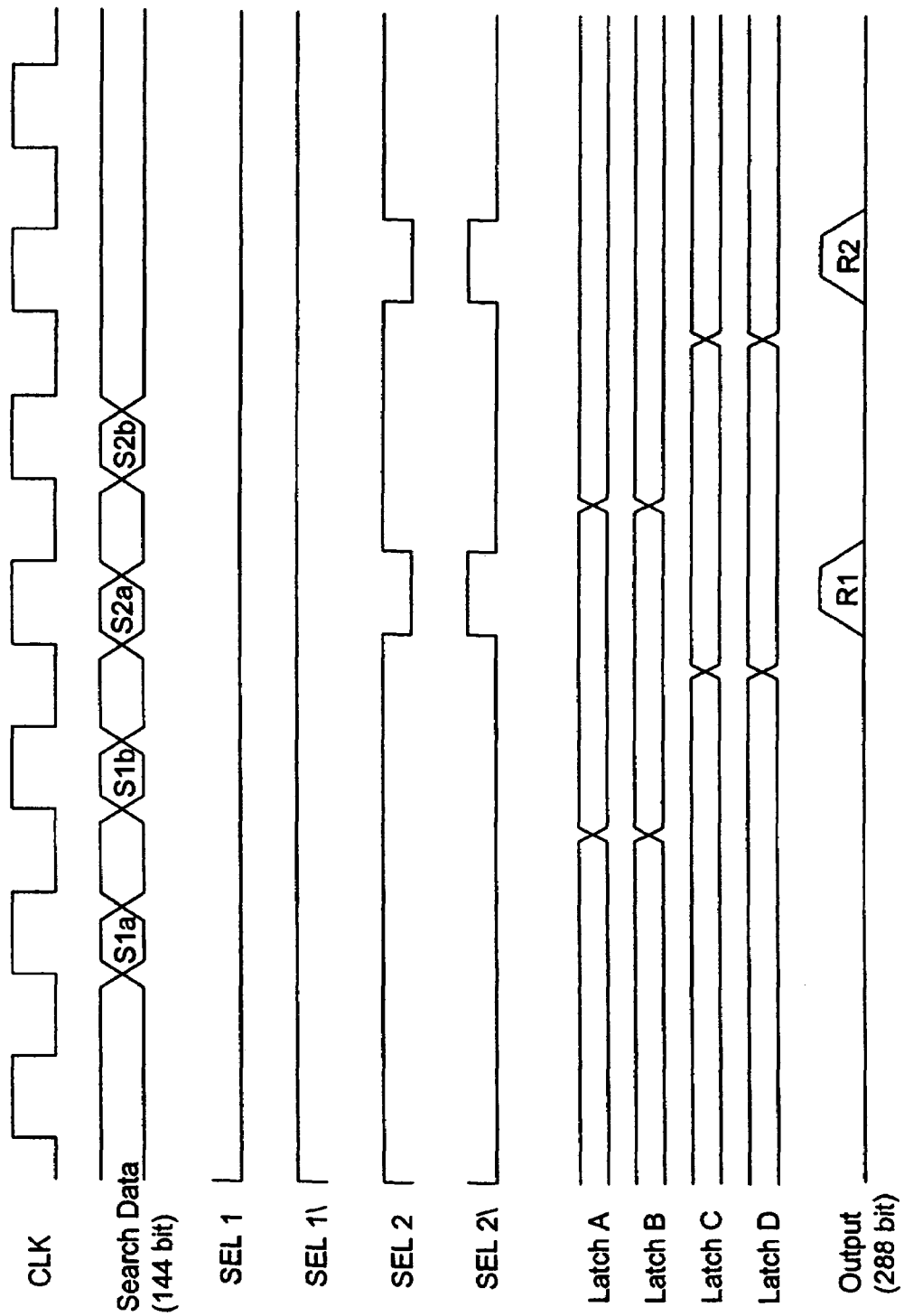
FIG. 6 is a timing diagram showing a 288 bit wide search operation according to the present invention.

FIGS. 4, 5 and 6 illustrate simplified relative timing signals corresponding to the 72, 144 and 288 bit wide search operations.

On FIG. 4, the user (i.e. processor) provides a 72 bit search data S1 to both CAM arrays 102 and 104. All latches for matchlines A, B, C and D are latched and the result R1 is provided to the priority encoder and multiple match resolver 106. Subsequent 72 bit searches can be submitted in the same manner, providing respective results R2, R3, R4 as shown.

FIG. 5 corresponds to a 144 bit search operation and is similar to FIG. 4 with the difference that the search key provided is 144 bit wide and the output 144 bit wide output R1 represents the combination of signals AB or CD respectively.

FIG. 6 corresponds to a 288 bit wide search operation and differs from the previous two timing diagrams in the sense that the search data is provided in two steps, shown as S1$a$ for the first 144 bit search key and S1$b$ for the second 144 bit search key. During the first search cycle, latches A and B are activated and their result remains unchanged through the following search cycle when the second search is performed (S1$b$) and latches C and D are activated. Once all four signals comprising the result of the 288 bit search are available, the ABCD signal is delivered to the priority encoder and multiple match resolver; 106 as R1.

A further advantage of the present invention which can be obtained while performing 288 bit searches is that the user can retain a partial 144 bit search result and combine it with another 144 bit search key and obtain the 288 bit search result in the subsequent clock cycle. For example, if a first 288 bit search word is provided to the CAM as two sequentially submitted 144 bit words, the result of the 288 bit search will be available for the priority encoder/multiple match resolver 106 in two clock cycles as discussed with reference to FIG. 6. The search will comprise two consecutive 144 bit searches. According to the preferred embodiment of the invention described above, the CAM will selectively latch the first 144 bit search result (AB) in the first clock cycle and then selectively latch the second 144 bit search result (CD) in the second clock cycle. Since both search results (AB and CD) are stored in their respective latches, during a third clock cycle, if a new 288 bit search is issued with search key ABC'D' for example, the outputs AB from the first clock cycle can be combined with the new 144 bit search of C'D' to yield a new intermediate 288 bit search ABC'D' result without having to re-search the entire 288 bits. Thus we need only assert LTEN 2. Consequently, the user can change any 144 bit portion of a 288 bit search word and obtain the result of the new 288 bit search in one subsequent clock cycle.

This type of variable word width searching therefore allows large word width searches to take place without having to re-search previous bits, which have already been searched. This allows the user to change only a certain portion of the wide word and re-do the search rather than having to re-search the entire wide word. Furthermore, this structure does not require wrap-around storage of wide words, i.e. storage of words that are wider than the width of an array and are continued or "wrapped around" in a subsequent-row of the same array.

It may be noted that the timing diagrams as shown are intended to show the sequence of signals on the various inputs, however the relative timing between signals will vary depending on the particular CAM design being used. Thus a person skilled in the art would recognize that a normal latency comprising some clock cycles, is included between the normal operation of a CAM like this, which means that the address that is retrieved by the user will not be available directly in the "following clock cycle". If the CAM comprises features as segmented matchlines, pre-search and main search, cascaded features, etc. the delay time is increased for the overall normal operation of the chip.

Although the invention has been described with reference to specific embodiments, various modifications will become apparent to a person skilled in the art without departing from the spirit of the invention.

The embodiments of the invention in which an exclusive property or privilege is claimed, are defined as follows:

1. A content addressable memory (CAM) for performing search operations on variable width search data, said CAM comprising:
   a) a plurality of arrays of CAM cells, coupled to a respective sub-search data bus, the sub-search data buses being combined to form a main search data bus for receiving said search data;
   b) combining circuits connected to match lines and receiving at least two match line signals from respective CAM arrays, the match line signals being indicative of the results of a search and comparison operation performed in the associated CAM array; and c) a selector circuit being responsive to a mode selection signal for selecting one or more output signals from the combining circuits to be switched to a processing circuit.

2. A CAM as defined in claim 1, including a latch coupled to each match line to latch its corresponding match line signal.

3. A CAM as defined in claim 1, wherein said processing circuit comprises a priority address encoder and multiple match resolver.

4. A method for performing variable word width searching in a content addressable memory, said method comprising the steps of:
  (a) selectively combining match line latch outputs from two adjacent CAM memory arrays; and
  (b) providing the selectively combined match line outputs to a processing circuit in response to a variable word width control signal, such that in a first mode the processing circuit will simultaneously receive and process four separate match line latch outputs in adjacent arrays and in a second mode a combination of two match line latch outputs are provided from two adjacent arrays to the processing circuit.

5. A method as defined in claim 4, wherein said first mode comprises a 72-bit search.

6. A method as defined in claim 4, wherein said second mode comprises a 144-bit search.

7. A method as defined in claim 4, further comprising a third mode for combining four match line latch outputs and providing said combination of four match line latch outputs to the processing circuit.

8. A method as defined in claim 7, wherein said third mode comprises 288-bit search.

9. A method as defined in claim 5, wherein said first mode comprises a single width search.

10. A method as defined in claim 5, wherein said second mode comprises a double width search.

11. A method as defined in claim 7, wherein said third mode comprises a quadruple width search.

* * * * *